United States Patent
Son et al.

(10) Patent No.: US 11,709,410 B2
(45) Date of Patent: Jul. 25, 2023

(54) BLACK BARRIER WALL PATTERN FILM AND METHOD FOR MANUFACTURING SAME

(71) Applicant: LG CHEM, LTD., Seoul (KR)

(72) Inventors: Yong Goo Son, Daejeon (KR); Nam Seok Bae, Daejeon (KR); Seung Heon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 494 days.

(21) Appl. No.: 16/762,609

(22) PCT Filed: Mar. 11, 2019

(86) PCT No.: PCT/KR2019/002784
§ 371 (c)(1),
(2) Date: May 8, 2020

(87) PCT Pub. No.: WO2019/190079
PCT Pub. Date: Oct. 3, 2019

(65) Prior Publication Data
US 2020/0272016 A1    Aug. 27, 2020

(30) Foreign Application Priority Data
Mar. 27, 2018    (KR) .......... 10-2018-0034975

(51) Int. Cl.
G09G 3/34    (2006.01)
G02F 1/167    (2019.01)
G03F 7/00    (2006.01)
G03F 7/028    (2006.01)

(52) U.S. Cl.
CPC ............ *G02F 1/167* (2013.01); *G03F 7/0002* (2013.01); *G03F 7/028* (2013.01)

(58) Field of Classification Search
CPC ........ G02F 1/167; G03F 7/028; G03F 7/0002; G09G 3/344
See application file for complete search history.

(56) References Cited

U.S. PATENT DOCUMENTS 9,829,759 B2 * 11/2017 Park .................. G02F 1/134309
2007/0157839 A1    7/2007 Kim et al.
2007/0207297 A1 *  9/2007 Lee ....................... H05K 3/107
                                                     428/209

(Continued)

FOREIGN PATENT DOCUMENTS

EP    3056942 A1    8/2016
JP    H09-049906    2/1997

(Continued)

OTHER PUBLICATIONS

Office Action of Japanese Patent Office in Appl'n No. 2020-526185 dated May 12, 2021.

(Continued)

*Primary Examiner* — Roy P Rabindranath
(74) *Attorney, Agent, or Firm* — Dentons US LLP

(57) ABSTRACT

Provided is a black partition wall pattern film that comprises: a transparent substrate; an electrode layer provided on the transparent substrate; a black partition wall pattern provided on the electrode layer; and a black UV-curable resin layer provided in a region of the electrode layer where no black partition wall pattern is provided.

11 Claims, 4 Drawing Sheets

(56) References Cited

U.S. PATENT DOCUMENTS

| | | | | |
|---|---|---|---|---|
| 2008/0262237 | A1* | 10/2008 | Kimura | C07D 519/00 |
| | | | | 546/298 |
| 2010/0123269 | A1 | 5/2010 | Nam et al. | |
| 2010/0165448 | A1 | 7/2010 | Sprague | |
| 2011/0315887 | A1* | 12/2011 | Inoue | G01T 1/2018 |
| | | | | 250/361 R |
| 2012/0013970 | A1 | 1/2012 | Shin et al. | |
| 2013/0044384 | A1 | 2/2013 | Kim et al. | |
| 2016/0238918 | A1 | 8/2016 | Nakashima | |
| 2016/0274412 | A1* | 9/2016 | Gu | G02F 1/1334 |
| 2017/0090237 | A1 | 3/2017 | Kim et al. | |
| 2017/0153525 | A1 | 6/2017 | Lim et al. | |
| 2017/0242167 | A1 | 8/2017 | Jia | |
| 2019/0081116 | A1* | 3/2019 | Kondo | H01L 27/3218 |
| 2019/0271877 | A1* | 9/2019 | Harrison | H01L 51/5262 |
| 2020/0142249 | A1* | 5/2020 | Kawahira | G02F 1/136209 |

FOREIGN PATENT DOCUMENTS

| | | |
|---|---|---|
| JP | 2005-321769 | 11/2005 |
| JP | 2010-170093 | 8/2010 |
| JP | 2010-197649 | 9/2010 |
| JP | 2010-204540 | 9/2010 |
| JP | 2010-271572 | 12/2010 |
| JP | 2012-078547 | 4/2012 |
| JP | 2014-035385 | 2/2014 |
| JP | 2016-148795 | 8/2016 |
| KR | 10-20050112940 | 12/2005 |
| KR | 10-20070074051 | 7/2007 |
| KR | 10-20080049252 | 6/2008 |
| KR | 10-20100053476 | 5/2010 |
| KR | 10-20100054681 | 5/2010 |
| KR | 10-2010-0079861 | 7/2010 |
| KR | 10-20110110005 | 10/2011 |
| KR | 10-20120034517 | 4/2012 |
| KR | 10-20130020313 | 2/2013 |
| KR | 10-20150062240 | 6/2015 |
| KR | 10-20170038579 | 4/2017 |
| KR | 10-20170089136 | 8/2017 |

OTHER PUBLICATIONS

International Search Report and the Written Opinion of PCT/KR2019/002784, dated Jun. 20, 2019.

Office Action of Korean Patent Office in Appl'n No. 10-2018-0034975 dated Mar. 3, 2020.

* cited by examiner

[Figure 1]   < Prior Art >
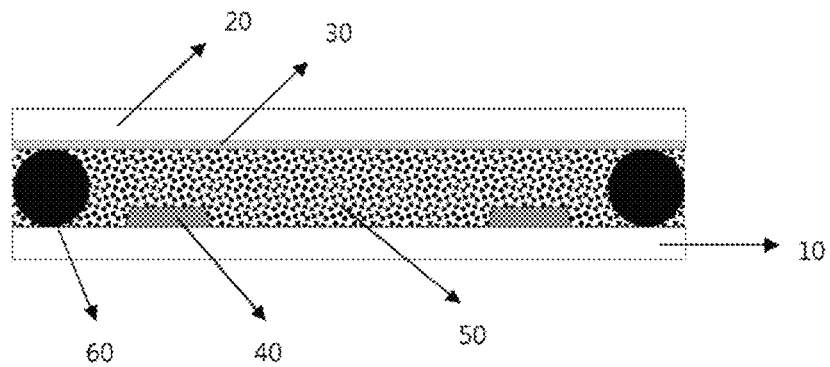
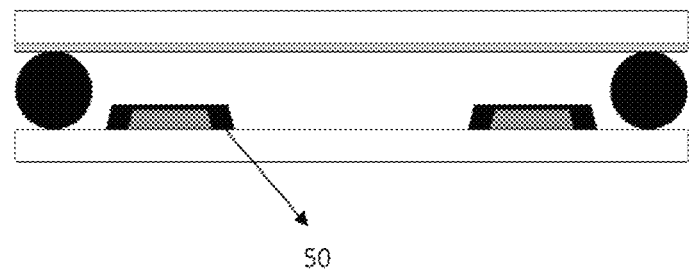
[Figure 2]
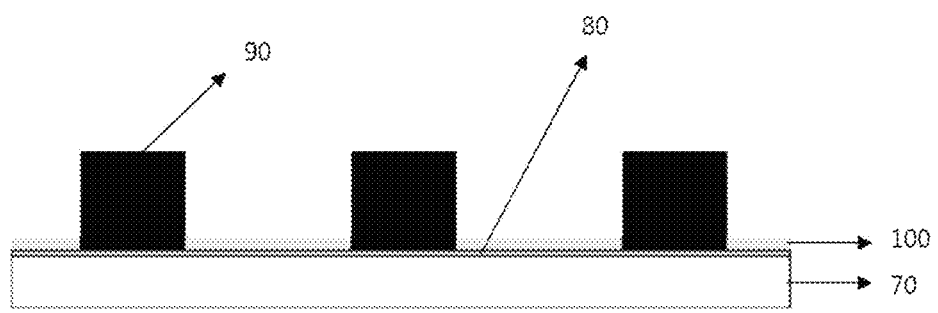

[Figure 3]
1) APPLY BLACK UV-CURABLE RESIN COMPOSITION ONTO ELECTRODE LAYER
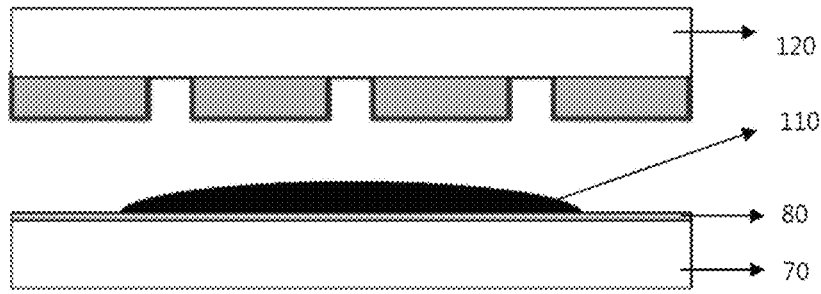
2) PRESS WITH INPRINTING MOLD AND CURE BLACK UV-CURABLE RESIN COMPOSITION
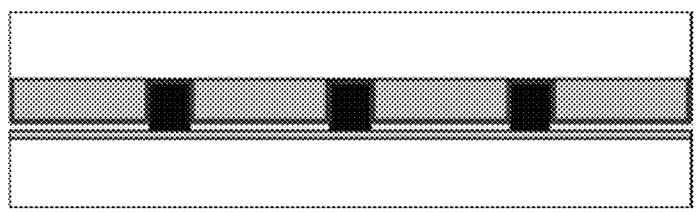
3) REMOVE IMPRINTING MOLD
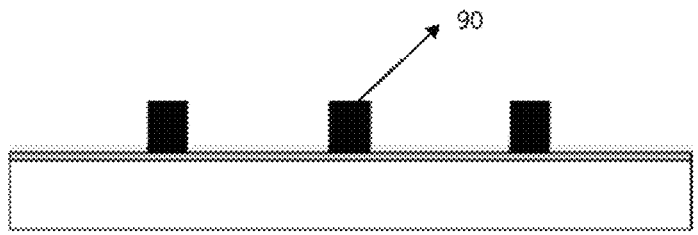

[Figure 4]
1) FORM DRY FILM RESIST ON TRANSPARENT BASE
2) EXPOSE DRY FILM RESIST
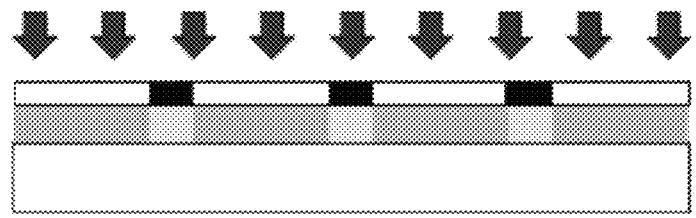
3) DEVELOP DRY FILM RESIST
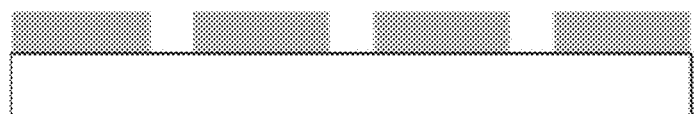
4) FORM RELEASE LAYER
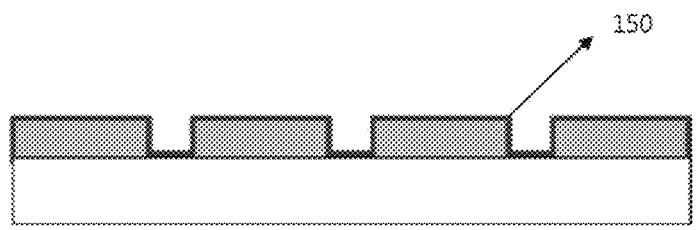

[Figure 5]
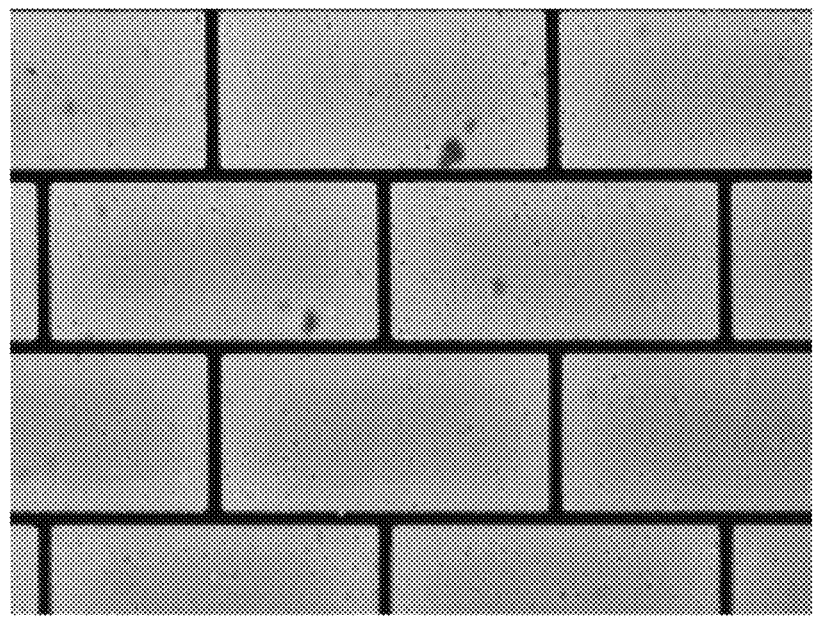
[Figure 6]
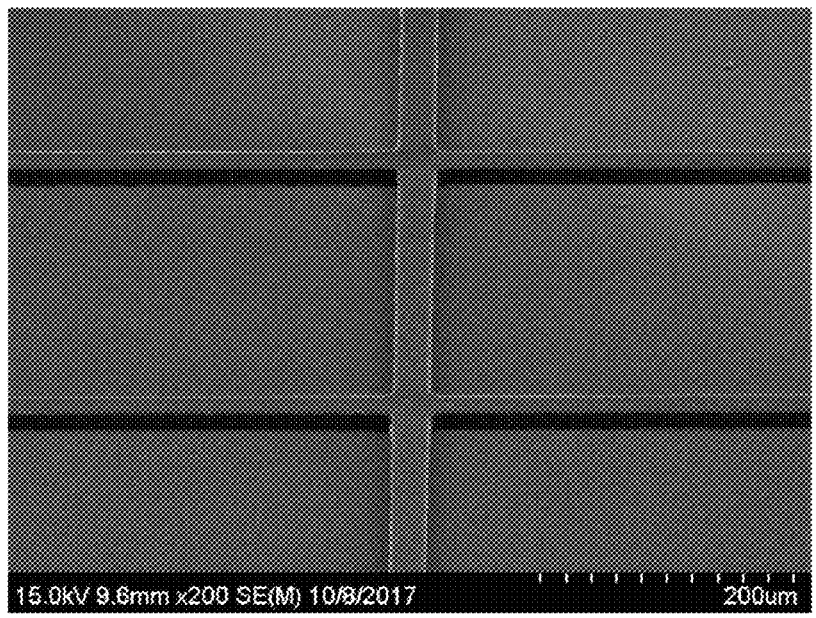

BLACK BARRIER WALL PATTERN FILM AND METHOD FOR MANUFACTURING SAME

CROSS-REFERENCE TO RELATED APPLICATIONS

This application is a National Stage Application of International Application No. PCT/KR2019/002784 filed on Mar. 11, 2019, which claims priority to and the benefit of Korean Patent Application No. 10-2018-0034975 filed with the Korean Intellectual Property Office on Mar. 27, 2018, the entire contents of which are incorporated herein by reference.

TECHNICAL FIELD

The present application relates to a black partition wall pattern film and a method of manufacturing the same.

BACKGROUND

An electrophoretic variable transmittance film is easy to transmit and block light entering from outside and thus can be used as a smart window for a building, a sunroof for a vehicle, and a light blocking film for a transparent display.

FIG. 1 is a view illustrating an operating principle of an electrophoretic variable transmittance film in the related art which operates in a light blocking mode or a light transmitting mode.

In general, as illustrated in FIG. 1, in order to switch from the light blocking mode to the light transmitting mode, a positive voltage is applied to a metal electrode pattern, and negatively charged nanoparticles are concentrated on the metal electrode pattern having a relatively small electrode width, such that the light blocking mode can be converted into the light transmitting mode.

However, there is a problem in that visibility is increased because of ball spacers used to maintain a distance between the metal electrode pattern and a transparent substrate in the electrophoretic variable transmittance film.

BRIEF DESCRIPTION

Technical Problem

The present application has been made in an effort to provide a black partition wall pattern film and a method of manufacturing the same.

Technical Solution

An exemplary embodiment of the present application provides a black partition wall pattern film comprising:
a transparent substrate;
an electrode layer provided on the transparent substrate;
a black partition wall pattern provided on the electrode layer; and
a black UV-curable resin layer provided in a region on the electrode layer where no black partition wall pattern is provided.

Provided is a black partition pattern film including the same.

In addition, another exemplary embodiment of the present application provides a method of manufacturing the black partition wall pattern film, the method comprising:
forming an electrode layer on a transparent substrate;
applying a black UV-curable resin composition onto the electrode layer;
pressing the applied black UV-curable resin composition with an imprinting mold and then curing the black UV-curable resin composition; and
removing the imprinting mold.

The present invention provides a method for manufacturing the black partition wall pattern film including the black partition wall pattern film.

In addition, still another exemplary embodiment of the present application provides a variable transmittance film comprising the black partition wall pattern film.

Advantageous Effects

According to the exemplary embodiment of the present application, since the black partition wall pattern is comprised, it is possible to prevent the transmittance from increasing in the light blocking mode when the exemplary embodiment is applied to an electrophoretic smart window.

In addition, according to the exemplary embodiment of the present application, since the black partition wall pattern film can be manufactured by using the imprinting process, it is possible to simplify the process of manufacturing the black partition wall pattern film and to form the black partition wall pattern having a desired line width.

BRIEF DESCRIPTION OF DRAWINGS

FIG. 1 is a view schematically illustrating a variable transmittance film in the related art.

FIG. 2 is a view schematically illustrating a black partition wall pattern film according to an exemplary embodiment of the present application.

FIG. 3 is a view schematically illustrating a method of manufacturing the black partition wall pattern film according to the exemplary embodiment of the present application.

FIG. 4 is a view schematically illustrating a method of manufacturing an imprinting mold according to the exemplary embodiment of the present application.

FIG. 5 is a view illustrating a microscopic image, in a light transmitting mode, of the black partition wall pattern film according to the exemplary embodiment of the present application.

FIG. 6 is a view illustrating an SEM image of the black partition wall pattern film according to the exemplary embodiment of the present application.

DESCRIPTION OF REFERENCE NUMERALS

10: First transparent substrate
20: Second transparent substrate
30: First electrode layer
40: Second electrode pattern
50: Negatively (−) charged carbon black nanoparticle
60: Ball spacer
70: Transparent substrate
80: Electrode layer
90: Black partition wall pattern
100: Black UV-curable resin layer
110: Black UV-curable resin composition
120: Imprinting mold
130: Transparent base
140: Dry film resist
150: Release layer

DETAILED DESCRIPTION

Hereinafter, the present application will be described in detail.

In the present application, the term "transparent" means that transmittance is about 80% or higher in a visible ray region (400 nm to 700 nm).

Typically, it is essential to use a transparent electrode film and a metal pattern electrode film in order to manufacture an electrophoretic variable transmittance film. In addition, a cell gap needs to be maintained in order to inject an electrophoretic substance such as a negatively (−) charged carbon black particle dispersed solution between the two electrode films. To this end, a ball spacer, a column spacer pattern, or a partition wall pattern needs to be provided. A variable transmittance film in the related art is schematically illustrated in FIG. 1.

In a case in which a photolithography process using a photosensitive resin composition is applied to manufacture the partition wall pattern, there is a limitation in implementing a partition wall pattern having a uniform line width in a large area. This is due to uniformity of an exposure gap of a photomask and a photosensitive resin composition layer and uniformity of application of the photosensitive resin composition layer.

In addition, in a case in which a transparent partition wall pattern is applied to manufacture the partition wall pattern, there can be a problem in that transmittance is increased in a light blocking mode when the exemplary embodiment is applied to a smart window. This problem can be caused by a leakage of light at the transparent partition wall pattern.

In addition, in a case in which the photolithography process is used to manufacture a black partition wall pattern, exposure energy is not transferred to a lower side due to high optical density of a black photosensitive resin composition, and as a result, the partition wall pattern may not be implemented. In addition, in a case in which the exposure energy is excessively emitted in order to solve the problems, there can be a problem in that a line width of the partition wall pattern is greatly increased.

Therefore, the present application provides a black partition wall pattern film and a method of manufacturing the same which are capable of solving the above-mentioned problems.

A black partition wall pattern film according to an exemplary embodiment of the present application comprises: a transparent substrate; an electrode layer provided on the transparent substrate; a black partition wall pattern provided on the electrode layer; and a black UV-curable resin layer provided in a region on the electrode layer where no black partition wall pattern is provided.

In the present application, the transparent substrate can be, but not limited to, a glass base or a transparent plastic base which is excellent in transparency, surface smoothness, tractability, and waterproofness, and the transparent base is not limited as long as the transparent base is typically used for electronic elements. Specifically, the transparent base can be made of glass, urethane resin, polyimide resin, polyester resin, (meth)acrylate-based polymeric resin, or polyolefin-based resin such as polyethylene or polypropylene.

In the present application, the electrode layer can comprise a transparent conductive oxide. More specifically, the electrode layer can comprise, but is not limited only to, one or more of an indium oxide, a zinc oxide, an indium tin oxide, an indium zinc oxide, and an indium zinc tin oxide.

In order to ensure a redispersion property of charged particles when the light blocking mode is activated, surface resistance of the electrode layer can be 200 Ω/sq. or less.

In the present application, a line height of the black partition wall pattern can be 5 μm or more, and a line width of the black partition wall pattern can be 30 μm or less. In addition, a line height of the black partition wall pattern can be 5 μm to 50 and a line width of the black partition wall pattern can be 5 μm to 30 μm. If the line height of the black partition wall pattern is less than 5 μm, a distance between a transparent electrode and a metal electrode pattern substrate is decreased, such that the content of negatively (−) charged nanoparticles in a dispersion liquid is excessively increased in order to ensure the transmittance of 1% or less in the light blocking mode, and as a result, there can be a problem in that a dispersion property of the negatively (−) charged nanoparticles deteriorates when a variable transmittance element operates. In addition, if the line height of the black partition wall pattern is more than 50 μm, the distance between the transparent electrode and the metal electrode pattern substrate is increased, and as a result, an operating speed can be decreased. A cell gap between the electrodes can be determined based on the line height of the black partition wall pattern. More specifically, if the cell gap is small, concentration of a light blocking dispersion liquid can be increased in order to ensure a light blocking property, and an excessive increase in concentration of charged particles can degrade dispersion stability. In addition, if the cell gap is large, intensity of an electric field formed between the transparent electrode and the metal pattern can be decreased, and an electrophoretic property, that is, a movement speed of particles can be decreased as the distance between the charged particles and the metal pattern is increased.

The transmittance of the black partition wall pattern can be 5% or less. In addition, the transmittance of the black partition wall pattern can be 0 to 5%. If the transmittance of the black partition wall pattern is more than 5%, there can be a problem in that the black partition wall pattern is visible in the light blocking mode. In the case of an electrophoretic variable transmittance film which is currently under development, the transmittance in the light blocking mode (a state in which a light blocking dispersion liquid is dispersed) is at a level of 1% to 5%. If the transmittance of the black partition wall pattern is higher than this level, a leakage of light can be visible at a partition wall part.

A line spacing of the black partition wall pattern can be 100 μm to 1,000 μm. If the line spacing of the black partition wall pattern is less than 100 μm, a range of variable transmittance can be decreased due to an increase in area of a region of the partition wall pattern. If the line spacing of the black partition wall pattern is more than 1,000 μm, it can be difficult to maintain a uniform cell gap of the electrophoretic element. There is no variable transmittance in a region in which the black partition wall pattern is present, and as a result, an area of the variable transmittance region is decreased if the line spacing of the black partition wall pattern is too small when the line width remains the same. In contrast, if the line spacing is too large, a substrate (film) is deformed during a process of laminating a transparent electrode substrate and a metal pattern substrate, and as a result, bubbles can be produced, and uniformity of the cell gap can deteriorate.

In the present application, a black UV-curable resin layer having a thickness equal to the line height of the black partition wall pattern is formed on an entire surface of a glass substrate, and then the transmittance can be measured by using a spectrophotometer (SolidSpec-3700, Shimadzu Corp.).

In the present application, a thickness of the black UV-curable resin layer can be 1 μm or less, and transmittance of the black UV-curable resin layer can be 80% or more. In addition, the thickness of the black UV-curable resin layer can be more than 0 and 1 μm or less, and the transmittance of the black UV-curable resin layer can be 80% or more and less than 100%. If the thickness of the black UV-curable resin layer is more than 1 μm, the formation of the electric field between the transparent electrode and the metal electrode pattern is hindered, and as a result, there can be a problem in that an operating property of the electrophoretic element can deteriorate. In addition, if the transmittance of the black UV-curable resin layer is less than 80%, the transmittance is decreased in a light transmitting mode, and as a result, there can be a problem in that a variable transmittance range of the electrophoretic element is decreased.

In the present application, the black partition wall pattern and the black UV-curable resin layer each can be made of a black UV-curable resin composition, and the black UV-curable resin composition can comprise, but is not limited only to, one or more of an acrylic monomer, an acrylic oligomer, a photoinitiator, a black pigment, and a black dye.

In the present application, the black partition wall pattern and the black UV-curable resin layer can be simultaneously formed by applying the black UV-curable resin composition onto the electrode layer and then performing an imprinting process. That is, the black partition wall pattern and the black UV-curable resin layer can comprise the same material.

The black partition wall pattern film according to the exemplary embodiment of the present application is schematically illustrated in FIG. 2. As illustrated in FIG. 2, the black partition wall pattern film according to the exemplary embodiment of the present application comprises: a transparent substrate 70; an electrode layer 80 provided on the transparent substrate 70; a black partition wall pattern 90 provided on the electrode layer 80; and a black UV-curable resin layer 100 provided in a region on the electrode layer 80 where no black partition wall pattern 90 is provided.

In addition, a method of manufacturing the black partition wall pattern film according to the exemplary embodiment of the present application comprises: forming an electrode layer on a transparent substrate; applying a black UV-curable resin composition on the electrode layer; pressing the applied black UV-curable resin composition with an imprinting mold and then curing the black UV-curable resin composition; and removing the imprinting mold.

The method of manufacturing the black partition wall pattern film according to the exemplary embodiment of the present application is schematically illustrated in FIG. 3. As illustrated in FIG. 3, the method of manufacturing the black partition wall pattern film according to the exemplary embodiment of the present application comprises: forming the electrode layer 80 on the transparent substrate 70; applying a black UV-curable resin composition 110 onto the electrode layer 80; pressing the applied black UV-curable resin composition 110 with an imprinting mold 120 and then curing the black UV-curable resin composition 110; and removing the imprinting mold 120.

In the present application, the forming of the electrode layer on the transparent substrate can use a method known in this technical field. More specifically, the forming of the electrode layer on the transparent substrate can use, but is not limited only to, a deposition process or the like.

A method of manufacturing the imprinting mold according to the exemplary embodiment of the present application is schematically illustrated in FIG. 4. More specifically, the imprinting mold can be manufactured by a manufacturing method comprising, but not limited only to, forming a dry film resist 140 on a transparent base 130; forming a pattern by exposing and developing the dry film resist 140; and forming a release layer 150 on the transparent base and the pattern.

The release layer can be implemented as a layer with a mixture of fluorine-based and silicone-based release materials. A thickness of the release layer can be, but is not limited only to, 100 nm or less. Examples of a method of forming the release layer comprise a wet coating method, a vapor deposition method, and the like, and the vapor deposition method is advantageous in implementing a uniform release layer on a surface having a stepped portion.

In addition, the exemplary embodiment of the present application provides a variable transmittance film comprising the black partition wall pattern film.

The variable transmittance film according to the exemplary embodiment of the present application can be formed by using a material and a method which are known in this technical field, except that the variable transmittance film comprises the black partition wall pattern film.

For example, the variable transmittance film can have a second transparent substrate having a second electrode pattern provided on the black partition wall pattern film. Negatively (−) charged nanoparticles are comprised between the electrode layer and the second electrode pattern of the black partition wall pattern film.

The negatively (−) charged nanoparticle can be, but is not limited only to, a carbon black nanoparticle.

The variable transmittance film can be manufactured by using, but is not limited only to, a method of preparing the above-mentioned variable transmittance film, and then injecting a solution, in which the negatively (−) charged nanoparticles are dispersed, between the electrode layer and the second electrode pattern of the black partition wall pattern film.

In the present application, the variable transmittance film can be operated by electrophoresis. The transmittance is decreased when the variable transmittance film according to the exemplary embodiment of the present application is in an OFF mode. The transmittance can be increased as the negatively (−) charged nanoparticles are concentrated on the metal pattern, which is a positive (+) electrode, due to the electrophoresis in an ON mode in which a voltage is applied to the electrode layer and the second electrode pattern.

Exemplary Embodiments

Hereinafter, the exemplary embodiment disclosed in the present specification will be described with reference to examples. However, the scope of the exemplary embodiment is not intended to be limited by the following examples.

EXAMPLES

Example 1

1) Manufacture of Imprinting Mold

A dry film resist (DFR) having a thickness of 25 μm was roll-laminated on a transparent PET film of 250 μm under a condition in which a temperature was 110° C., a rate was 1.3 mpm (meter per min), and a pressure was 0.4 MPa. Exposure energy of 150 mJ/cm$^2$ was selectively applied by using an exposure device using parallel light with a wavelength of 365 nm (photo process). A DFR pattern film having a debossed portion with a line width of 25 μm and a depth of 25 μm was manufactured by spray-developing the completely exposed DFR laminated film for 90 seconds by using a developer having $Na_2CO_3$ of 1 wt. % under a condition in which a temperature was 30° C. and a spray pressure was 0.2 MPa.

An imprinting mold was completely manufactured by forming a release layer having a thickness of 100 nm and having a mixture of fluorine-based and silicone-based release materials on the DFR pattern film by using a vapor deposition method.

2) Manufacture of Transparent UV-Curable Resin Composition

A transparent UV-curable resin composition was manufactured with compositions shown in Table 1.

TABLE 1

| Product Name | Manufacturer | Content (wt. %) |
|---|---|---|
| CN9010 NS (alicyclic urethane acrylate monomer) | Sartomer | 28.5 |
| CN8004 (alicyclic urethane acrylate monomer) | Sartomer | 28.5 |
| SR444NS (pentaerythritol triacrylate) | Sartomer | 38 |
| Irgacure 184 (photoinitiator) | Ciba | 4 |
| SR9051 (attachment force enhancer) | Sartomer | 1 |
| Total | | 100 |

3) Manufacture of Black UV-Curable Resin Composition

A black UV-curable resin composition was manufactured by mixing a black mill base of 20 parts by weight (carbon black of 20 parts by weight having a particle diameter of 100 nm, a dispersing agent of 4 parts by weight, and trimethylol propane triacrylate of 76 parts by weight) with the transparent UV-curable resin composition of 80 parts by weight.

4) Manufacture of Black Partition Wall Pattern Film

The black UV-curable resin composition was applied onto an ITO film having surface resistance of 150 Ω/sq., and then roll-pressed with the imprinting mold with a pressure of 0.5 MPa and a rate of 0.1 mpm. The ITO film having a black partition wall pattern was manufactured by irradiating the laminate, from above thereof, with exposure energy of 1 $J/cm^2$ by using a UV curing device with a wavelength of 365 nm and then separating the imprinting mold from the ITO film.

The black partition wall pattern manufactured by the imprinting process had a line width of 25 μm and a line height of 25 μm. A thickness of the black UV-curable resin layer in a region in which no black partition wall pattern is provided was 0.5 μm.

The transmittance of the black partition wall pattern was 3%, and the transmittance of the black UV-curable resin layer having no black partition wall pattern was 92%.

A black UV-curable resin layer having a thickness equal to a line height of the black partition wall pattern or the black UV-curable resin layer was formed on an entire surface of a glass substrate, and then the transmittance was measured by using a spectrophotometer (SolidSpec-3700, Shimadzu Corp.).

A microscopic image, in the light transmitting mode, of the black partition wall pattern film according to Example 1 is illustrated in FIG. 5, and an SEM image of the black partition wall pattern film is illustrated in FIG. 6.

Comparative Example 1

A transparent UV-curable resin was applied onto an ITO film having surface resistance of 150 Ω/sq., and then roll-pressed with the imprinting mold with a pressure of 0.5 MPa and at a rate of 0.1 mpm. The ITO film having a transparent partition wall pattern was manufactured by irradiating the laminate, from above thereof, with exposure energy of 1 $J/cm^2$ by using a UV curing device with a wavelength of 365 nm and then separating the imprinting mold from the ITO film.

The transparent partition wall pattern manufactured by the imprinting process had a line width of 25 μm and a line height of 25 μm. A thickness of the transparent UV-curable resin layer in a region in which no transparent partition wall pattern is provided was 0.5 μm.

The transmittance of the transparent partition wall pattern was 85%, and the transmittance of the transparent UV-curable resin layer having no transparent partition wall pattern was 95%.

As a result, according to the exemplary embodiment of the present application, since the black partition wall pattern is present, it is possible to prevent the transmittance from increasing in the light blocking mode when the exemplary embodiment is applied to an electrophoretic smart window.

In addition, according to the exemplary embodiment of the present application, since the black partition wall pattern film can be manufactured by using the imprinting process, it is possible to simplify the process of manufacturing the black partition wall pattern film and to form the black partition wall pattern having a desired line width.

The invention claimed is:

1. A variable transmittance film comprising:
   a transparent substrate;
   an electrode layer provided on the transparent substrate;
   a black partition wall pattern provided on the electrode layer; and
   a black UV-curable resin layer having a thickness in a range of more than 0 to 1 μm provided in a region on the electrode layer where no black partition wall pattern is provided,
   wherein the variable transmittance film comprises charged nanoparticles responsive to electrophoresis during which a voltage is applied.

2. The variable transmittance film of claim 1, wherein a line height of the black partition wall pattern is 5 μm or more.

3. The variable transmittance film of claim 1, wherein a line width of the black partition wall pattern is 30 μm or less.

4. The variable transmittance film of claim 1, wherein a transmittance of the black partition wall pattern is 5% or less.

5. The variable transmittance film of claim 1, wherein the black partition wall pattern and the black UV-curable resin layer each separately comprises one or more of an acrylic monomer, an acrylic oligomer, a photoinitiator, a black pigment, and a black dye.

6. The variable transmittance film of claim 1, wherein the electrode layer comprises a transparent conductive oxide.

7. The variable transmittance film of claim 6, wherein the transparent conductive oxide comprises one or more of an indium oxide, a zinc oxide, an indium tin oxide, an indium zinc oxide, and an indium zinc tin oxide.

8. A method of manufacturing the variable transmittance film of claim 1, the method comprising:
   forming an electrode layer on a transparent substrate;

applying a black UV-curable resin composition onto the electrode layer;

pressing the applied black UV-curable resin composition with an imprinting mold and then curing the black UV-curable resin composition;

removing the imprinting mold;

bonding a metal electrode pattern substrate; and injecting charged nanoparticles between the electrode layer and the metal electrode pattern substrate.

9. The variable transmittance film of claim 1, wherein a thickness of the black UV-curable resin layer is more than 0 and 1 µm or less.

10. The variable transmittance film of claim 1, wherein the black UV-curable resin layer has a transmittance of light of 400 nm to 700 nm that is 80% or more.

11. The black partition wall pattern film of claim 1, wherein the black UV-curable resin layer comprises trimethylol propane triacrylate prior to UV curing.

* * * * *